United States Patent [19]
Dickey et al.

[11] Patent Number: 5,106,474
[45] Date of Patent: Apr. 21, 1992

[54] ANODE STRUCTURES FOR MAGNETRON SPUTTERING APPARATUS

[75] Inventors: Eric R. Dickey; Erik J. Bjornard, both of Northfield, Minn.; James J. Hoffmann, Boise, Id.

[73] Assignee: Viratec Thin Films, Inc., Faribault, Minn.

[21] Appl. No.: 616,673

[22] Filed: Nov. 21, 1990

[51] Int. Cl.⁵ ............................................. C23C 14/34
[52] U.S. Cl. ...................... 204/298.14; 204/298.06; 204/298.21; 204/298.22; 204/298.23
[58] Field of Search ...................... 204/298.14, 298.21, 204/298.22, 298.23, 298.28, 192.12, 298.06, 298.11

[56] References Cited

U.S. PATENT DOCUMENTS

| | | | |
|---|---|---|---|
| 4,166,018 | 8/1979 | Chapin | 204/192 |
| 4,221,652 | 9/1980 | Kuriyama | 204/298.21 X |
| 4,356,073 | 10/1982 | McKelvey | 204/192 |
| 4,422,916 | 12/1983 | McKelvey | 204/298.22 X |
| 4,445,518 | 4/1984 | McKelvey | 204/298.22 X |
| 4,445,997 | 5/1984 | McKelvey | 204/298 |
| 4,466,877 | 8/1984 | McKelvey | 204/298 |
| 4,519,885 | 5/1985 | Innis | 204/192 |
| 4,545,882 | 10/1985 | McKelvey | 204/298.22 X |
| 4,619,755 | 10/1986 | Hessberger et al. | 204/298 |
| 4,818,358 | 4/1989 | Hubert et al. | 204/298 |

OTHER PUBLICATIONS

"Design Advances and Applications of the Rotatable Magnetron," Wright, M., et al., Proceedings of the 32nd National Symposium of the American Vacuum Society, vol. 4, No. 3, Part 1, pp. 388–392 (1986).

"Recent Advances in the Design and Application of the Rotatable Cylindrical Magnetron," Wright, M., et al., Annual Technical Conference, Society of Vacuum Coaters (1986).

"Inline Production Magnetron Sputtering," Aronson, A., et al., Vacuum, vol. 27, No. 3, pp. 151–153 (1977).

"DC Reactive Sputtering Using A Rotating Cylindrical Magnetron," Hofmann, J., Proceedings of the 32nd Annual Conference of the Society of Vacuum Coaters, pp. 297–300 (1989).

Primary Examiner—Nam Nguyen
Attorney, Agent, or Firm—Heller, Ehrman, White & McAuliffe

[57] ABSTRACT

An in-line sputtering system with rotating cylindrical magnetrons is fitted with a system of anodes having a large surface area. The surface area is equal to or greater than the surface area of the sputtering chambers' internal walls. The anodes may be grounded, allowed to float electrically, or connected to a separate bias power supply. The anode surfaces are protected from contamination by sputtered material or are designed so the electron collecting surface may be replaced during the sputtering process. The anodes may be equipped with a magnet array for improving electron collecting efficiency.

34 Claims, 6 Drawing Sheets

ANODE STRUCTURES FOR MAGNETRON SPUTTERING APPARATUS

BACKGROUND OF THE INVENTION

The present invention relates generally to magnetron sputtering apparatus, and more particularly to anode structures for magnetrons.

The spatial and temporal film thickness variations of precision optical coatings, such as multilayer antireflection (AR) coatings, generally must be held to within about plus or minus one percent to maintain the coatings desired optical properties. For economical production, it is desirable to apply the coatings in large area, in-line sputtering apparatus about one meter or greater in width.

DC reactive sputtering is the process most often used for large area commercial coating applications, such as the application of thermal control coatings to architectural and automobile glazings. In this process, the articles to be coated are passed through a series of in-line vacuum chambers isolated from one another by vacuum locks. Such a system may be referred to as a continuous in-line system or simply a glass coater.

Inside the chambers, a sputtering gas discharge is maintained at a partial vacuum at a pressure of about three millitorr. The sputtering gas comprises a mixture of an inert gas, such as argon, with a small proportion of a reactive gas, such as oxygen, for the formation of oxides.

Each chamber contains one or more cathodes held at a negative potential of about $-200$ to $-1000$ volts. The cathodes may be in the form of elongated rectangles, the length of which spans the width of the chambers. The cathodes are typically 0.10 to 0.30 meters wide and a meter or greater in length. A layer of material to be sputtered is applied to the cathode surface. This surface layer or material is known as the target material. The reactive gas forms the appropriate compound with the target material.

Ions from the sputtering gas discharge are accelerated into the target and dislodge, or sputter off, atoms of the target material. These atoms, in turn, are deposited on a substrate, such as a glass sheet, passing beneath the target. The atoms react on the substrate with the reactive gas in the sputtering gas discharge to form a thin film.

The architectural glass coating process was made commercially feasible by the development of the magnetically-enhanced planar magnetron. This magnetron has an array of magnets arranged in the form of a closed loop and mounted in a fixed position behind the target. A magnetic field in the form of a closed loop is thus formed in front of the target. The magnetic field traps electrons from the discharge and causes them to travel in a spiral pattern. This creates more intense ionization and higher sputtering rates. The planar magnetron is described in U.S. Pat. No. 4,166,018.

Despite the development of the magnetically-enhanced planar magnetron, it was still not feasible to deposit high-precision, optical coatings, such as AR coatings, on a scale and cost sufficient to justify the use of such coatings on glazings for picture frames, display cases, architectural products, and similar low-cost products.

The simplest AR coating is twice as thick as a thermal control coating. Therefore, higher deposition rates are required to obtain a comparable production cost between the two types of coatings. Additionally, thermal control coatings can tolerate thickness variations of about plus or minus five percent without significant performance variations. Multilayer AR coatings, as noted, begin to show perceptible variations when thickness variations exceed plus or minus one percent. These variations are observed primarily as variations in the reflection color. However, as errors increase beyond the one percent range, the reflection value itself may increase dramatically.

AR coatings require a low refractive index material, such as silicon dioxide, as the outer film. At high deposition rates, and with accuracy and long term stability, this material is extremely difficult to deposit using DC reactive sputtering processes. Particularly, thickness variations tend to occur in the outer film, causing perceptible color performance variations.

The rotary or rotating cylindrical magnetron was developed to overcome some of the problems inherent in the planar magnetron. The rotating magnetron uses a cylindrical cathode. The cathode is rotated continually over a magnetic array which defines the sputtering zone. As such, a new portion of the target is continually presented to the sputtering zone which eases cooling problems and allows higher operating powers. The rotation of the cathode also ensures that the erosion zone comprises the entire circumference of the cathode covered by the sputtering zone. This increases target utilization. The rotating magnetron is described in U.S. Pat. Nos. 4,356,073 and 4,422,916, the entire disclosures of which are hereby incorporated by reference.

If the cylindrical cathode is sufficiently long in relation to its diameter, or more precisely to the width of the intense plasma created by the magnetic tunnel field, a flat article passed beneath the cathode, such that its surface plane is parallel to the rotational axis of the cathode, will receive a film of equal thickness across its width. Care, however, must be taken to ensure that the magnetic field is constant along the cathode surface. Nonetheless, some loss of uniformity is inevitable at the extreme ends of the cathode where the magnet array is terminated. This is referred as the "end effect". Also, articles requiring a more or less uniform film can not be wider than the cathode length minus twice the "end effect" length.

If the walls of the coating chamber serve as an anode, the different path lengths from the cathode to the chamber walls can cause variations in the plasma potential along the cathode. Such variations can cause non-uniform film deposition to an extent greater than would be anticipated by the magnetic field "end effect." Under such conditions, it may only be possible to achieve film thickness uniformity of plus or minus one percent over a relatively small portion of the article or substrate being coated.

Furthermore, as sputtering progresses, coating material begins to deposit on the coating chamber walls and other internal components of the coater. As such, particularly when the coating material is an effective insulator like silicon dioxide, the electrical characteristics of the enclosure walls may change with time. This, in turn, may cause the sputtering plasma characteristics to change, causing, over time, variations in uniformity and film thickness. These effects can combine to shorten the useful operating period of the machine, if the film thickness changes exceed the tolerable accuracy limits for the coating being applied.

In view of the foregoing, an object of the present invention is to provide a sputtering apparatus capable of depositing thin films with a uniformity of about plus or minus one percent, and capable of maintaining such accuracy for extended periods.

Another object of the present invention is to provide a sputtering apparatus capable of producing cost effective, precision AR coatings for picture framing glass, display cases, architectural products, and lighting fixtures.

Additional objects and advantages of the invention will be set forth in the description which follows, and in part will be obvious from the description or may be learned by practice of the invention. The objects and the advantages of the invention may be realized and obtained by means of the instrumentalities and combinations particularly pointed out in the claims.

SUMMARY OF THE INVENTION

The present invention provides an auxiliary anode structure which is not a part of the basic structure of the coating chamber. The anode structure preferably has a surface area comparable with or greater than the surface area of the cathode. The anode structure may be designed such that a substantial fraction thereof is kept free of contamination by material sputtered from the cathode. The anode structure may be mounted within the coating chamber such that the electrical connection thereto may be to ground or to a source of electrical potential. The anode structure may also be allowed to float electrically such that it acquires the local potential of the sputtering discharge.

BRIEF DESCRIPTION OF THE DRAWINGS

The accompanying drawings, which are incorporated in and constitute a part of the specification, schematically illustrate embodiments of the invention and together with the general description given above and the detailed description of the embodiments given below, serve to explain the principles of the invention.

DETAILED DESCRIPTION OF THE INVENTION

Figure 1:
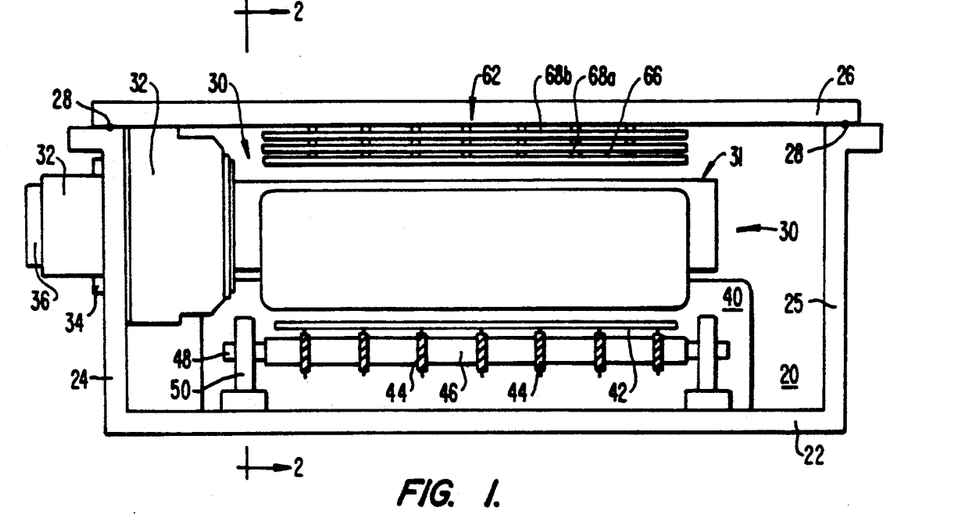
FIG. 1 is a schematic cross-section of a coating chamber showing an anode assembly in accordance with the present invention.
Figure 2:
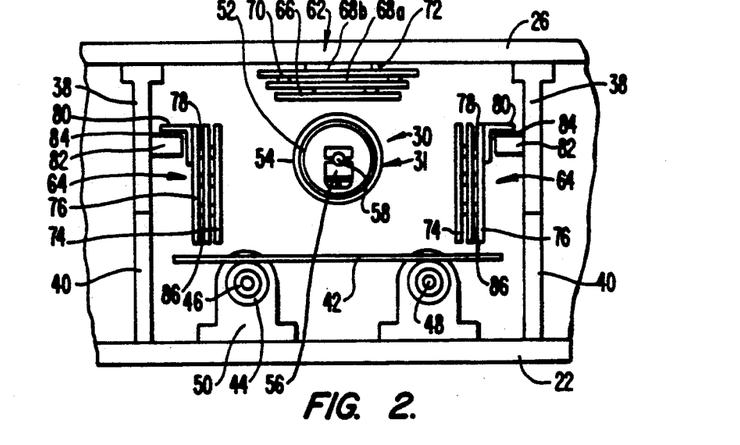
FIG. 2 is a schematic view along line 2—2 of FIG. 1.
Figure 3:
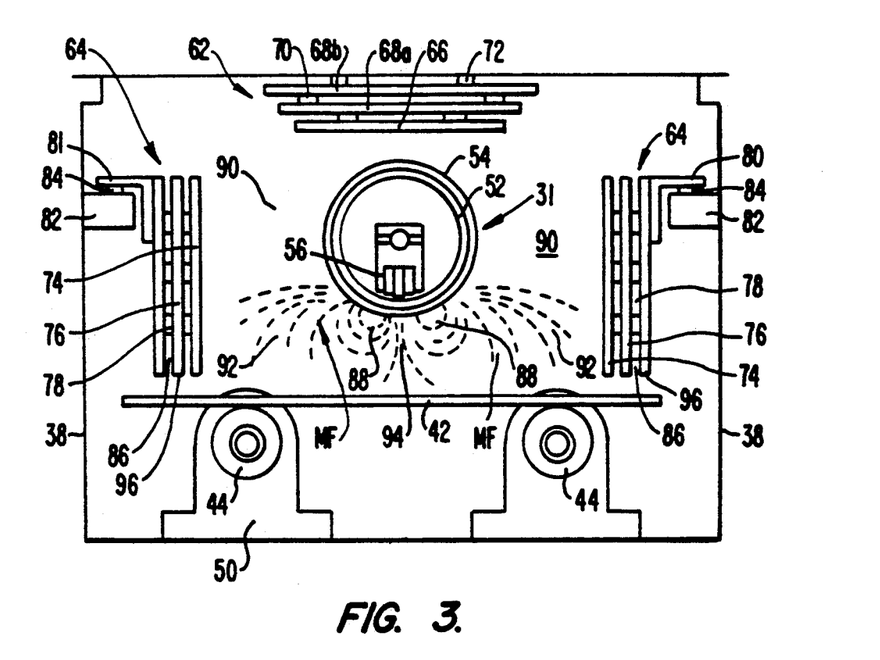
FIG. 3 is an enlarged schematic view of FIG. 2 showing the force lines produced by the magnetron and anode assembly.

Referring in detail to the drawings, wherein like reference numerals designate like parts in several figures, reference is initially made to FIGS. 1-3, which illustrate the preferred embodiment of the present invention. As shown, a vacuum or evacuable coating chamber 20 is defined by a base or floor 22, side walls 24 and 25, and a removable top 26. The top cover 26 is sealed to side walls 24 and 25 by a vacuum seal 28. A rotating magnetron 30 is mounted within chamber 20. More specifically, a substantially cylindrical cathode 31 of the magnetron is mounted to a rotating vacuum seal unit 32, which extends through an aperture in side wall 24 and is mounted thereto by means of a flange 34. The drive for rotating cathode 31 is applied to a drive shaft 36. Electrical power and water cooling for cathode 31 are communicated through shaft 36. The drive and electrical and cooling connections are not described in any greater detail as they are well known in the art.

The coating chamber 20 may be part of a larger enclosure comprising several such coating chambers 20 typical of in-line sputtering apparatus. As shown in FIG. 2, coating chamber 20 is separated from the adjacent chambers by internal walls or bulkheads 38 in which openings 40 are provided to allow the passage of a substrate 42. The substrate 42 is transported through the enclosure on rollers 44 attached to a shaft 46 having a spindle 48 mounted in bearings 50.

The cathode 31 typically comprises a tubular body 52 to which a target material 54 has been applied. The cathode 31 is hollow and has a fixed magnet array 56 suspended within it from the cooling water input tube 58 as shown in FIGS. 2 and 3. In the cantilever mounted arrangement shown, the free end of cathode 31 is sealed, for example, by a plug (not shown). The structure for mounting the cathodes in the coating chambers is not described in any detail, as such structure is well known in the art.

The present invention comprises the anode assembly or anode structures 62 and 64. Anode 62 is located above cathode 31 where it is secured to removable top 26. Anodes 64 are located on either side of the cathode where they are secured to respective internal walls 38 between adjacent coating chambers. The anodes are long enough to cover the entire length of cathode 31.

The top anode structure 62 comprises a front plate 66 and a plurality of additional plates 68a and 68b separated from each other and electrically-connected by spacers 70. The plates are mounted parallel to each other in a face-to-face relationship with the plates oriented horizontally. The structure is mounted to, but electrically isolated from, removable top 26 by insulating mounts 72. Front plate 66 is narrower than plates 68a and 68b, and middle plate 68a is narrower than plate 68b. Of course, a different number of plates and/or plates of different widths may be used. The number of plates is not critical. Two plates may be sufficient for certain applications. More than three plates may be used if it is deemed desirable to further increase the total anode area. A point will eventually be reached where the additional area has no advantageous effect. Other considerations such as available space in the coating chamber may limit the number of plates used.

The plates are preferably rectangular in shape with rounded edges to avoid points from which arcs may occur. Side anode plates are preferably between about one and one and one-half cathode diameters in width, and about two inches shorter than the cathode length. Top anode plates may be between one and one-half, and two cathode diameters in width. In a machine wide enough to coat thirty-six inch wide substrates, the plates would be about 9 inches wide and thirty-six inches long. The cathode 30 may be about 40 inches long.

The front plate 66 of top anode structure 62 must be separated from the periphery of cathode 30 by a distance greater than the cathode dark space length. The cathode dark space length is the distance that an electron leaving the surface of the cathode must travel in order to gain enough energy to cause ionization of the sputtering gas. A length of about 3 millimeters (mm) is typical for a pressure of 3 millitorr and an applied voltage of approximately 500 volts. A distance about equal to the cathode diameter is preferred for the distance between the cathode and top anode structure.

The side anode structures 64 each comprise a front plate 74 and a plurality of additional plates 76. The plates are mounted parallel to each other in a face-to-face relationship, with the plates oriented vertically. The plates are joined, spaced, and electrically-connected by bushings 78. The side anodes 64 are attached by brackets 80 to mounts 82 on walls 38, and electrically insulated from walls 38 by insulating bushings 84. The front plate 74 of each side anode structure 64 is typically located about 3 to 6 inches from the periphery of the cathode. The gaps 86 between the plates 76 are about 3 to 5 times the cathode dark space length. The dimension of the side anode plates 74 and 76 is about 9 inches wide by about 36 inches long. A total of three plates per side anode structure 64 has been found to provide an adequate total surface area.

The plates 66, 66a and 68b of top anode 62 are preferably made narrower the closer they are to the cathode. This allows for easier electron access to the gaps between the plates. In top anode 62, the need for the front plate to protect the remaining plates is of lesser importance than in side anodes 64. Direct incidence of coating material on the top anode 62 is about an order of magnitude less likely than in the case of side anodes 64.

FIG. 3 illustrates the form of a magnetic field, represented generally by references letters MF, arising from magnet array 56. The electron density is greatest in regions 88 where a tunnel field is formed by closing of the magnetic field lines. Electrons entering region 88, or generated therein by the ionization process, must follow long spiral paths before they can escape.

Electron density is lower in regions 90 where the magnetic field has little or no effect on the plasma conditions. In the regions 92 and 94, where the lines of force do not form a closed tunnel, electrons can escape and will generally follow a path corresponding to the magnetic field lines as illustrated. As the tunnel regions 88 are generally close together, region 94 is relatively small. The most likely escape paths for the electrons will be in regions 92. Accordingly, it is advisable to locate the bottom edge 96 of the side anode assemblies 64, i.e. the bottom edges of the anode plates, as close to the plane of substrate 42 as practically possible A clearance of 2 or 3 inches should be adequate.

Electrical connections to anode structures 62 and 64 are provided so any structure or combination of structures can be grounded, electrically isolated and allowed to float at a self-bias potential, or connected to a separate power supply for the purpose of applying a positive bias potential. The electrical connection may be provided by standard electrical vacuum feedthroughs. The feedthroughs are best located in the chamber wall adjacent the appropriate anode assembly.

A goal of the present invention is to provide the largest possible area of clean electrically-conductive anode surface adjacent the cathode. Preferably, the anode surface area should be at least the same as the area of the inner surface of the chamber in which the cathode is located. The anode surface can thus dominate the process of conducting the electrons from the sputtering discharge.

All of the plates of the anode together form the total electron collecting surfaces. Each plate has two exposed surfaces on which electrons can impact. For example, in side anodes 64, plates 74 and 76 are about two-thirds the length and about one-half the height of end wall 38 on which they are mounted. The collecting surface of side anode 64 has thus about two times the area of end wall 38. Only one surface of plate 74 is exposed to direct impact by material sputtered from cathode 30. The rear face of plate 74 and the faces of other plates 76 may not be directly impacted by coating material. Thus, of six total faces, only the front face of plate 74 becomes quickly contaminated. Thus, five-sixths of the area is protected. The protected surfaces remain clean and conductive over a relatively long operating period.

The anode plates 68a, 68b and 76 may be contaminated by oxidation. For this reason, it is advisable to make all anode plates, other than front plates 66 and 74, from a material which does not readily oxidize, such as stainless steel. The front plates may be made of a material that retains the coating buildup to prevent flakes of coating from falling onto the substrate. Aluminum is a good choice for the front plate material.

Figure 4:
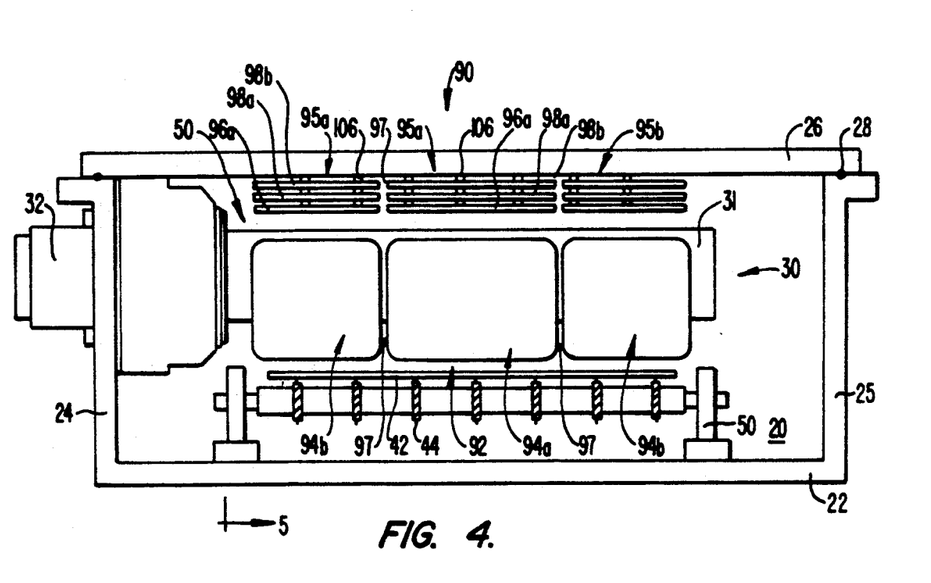
FIG. 4 is a schematic cross-section of a coating chamber showing another embodiment of an anode assembly in accordance with the present invention.
Figure 5:
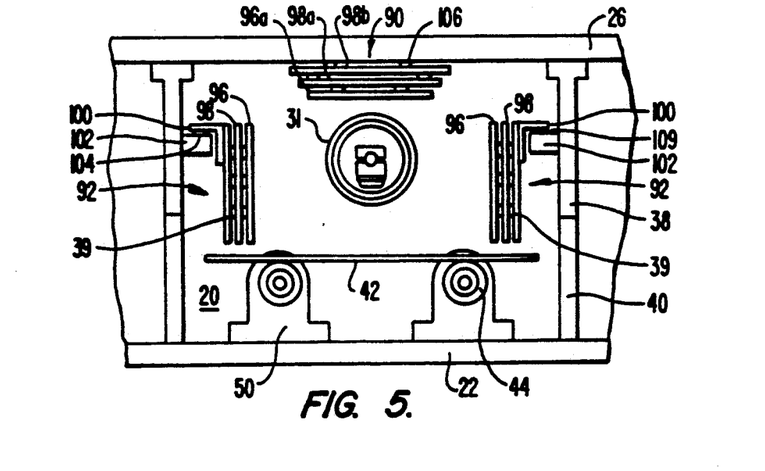
FIG. 5 is a schematic view along line 5—5 of FIG. 4.

Another embodiment of the present invention is shown in FIG. 4 and FIG. 5. Here, top anode assembly 90 includes a center section 95a and end sections 95b disposed along the width of cathode 31. Side anode assembly 92 includes a center section 94a and end sections 94b disposed along the length of cathode 31.

The anode sections 94a and 94b include a front plate 96 and a plurality of additional plates 98 separated and mechanically- and electrically-connected by spacers 39. The sections 94a and 94b are mounted on brackets 100. The brackets 100 are attached to internal chamber walls (end walls) 38 by mounts 102 and insulating bushings 104. They are thus electrically isolated from adjacent anode sections.

Top anode sections 95a and 95b are mounted on top cover 26 by insulating bushings 106. They include a front plate 96a and a plurality of additional plates 98a and 98b. The plates 98a and 98b preferably increase in width the further they are from plate 96a. The reasons for this are discussed in the description of the first embodiment above. The width of the plates is generally selective according to the description given above.

Gaps 97 separating sections, for example 94a and 94b, should be the minimum consistent with maintaining electrical isolation between sections it should be but wide enough to avoid closure by accumulation of coating material therein. A gap of about one millimeter is adequate.

As discussed above, electrical connections to the top and side anodes are provided by a separate terminal attached to a separate electrical vacuum feed through may be provided such that any anode or combination of anodes can be grounded, isolated and allowed to float at a self-bias potential, or connected to a separate power supply for the purpose of applying a bias potential. By applying different electrical potentials to each anode section, it is possible to establish different plasma conditions along the length of the cathode. This can help establish additional control of film uniformity or to effect corrections should the uniformity change during operation.

Again, it should be apparent that the different anode sections need not be the same dimension. It will further be apparent that, particularly for end sections 94b and 95b, some anode plate shape other than rectangular may be used. In practice, however, it may be expedient to employ, as shown in FIGS. 4 and 5, only as many top anode sections 95a and 95b as side anode sections 95a and 94b, and adjacent top and side anode sections, for example 94a an 95a, of equal length. The sections are preferably symmetrically disposed across the width of substrate 42. Thus, the discharge conditions may be maintained symmetrical about the cathode mid-point.

Figure 6:
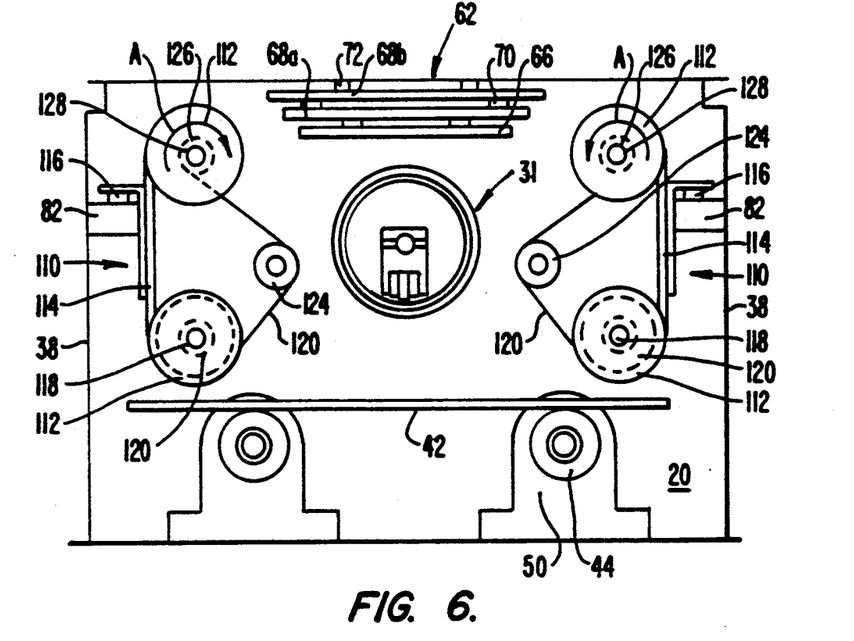
FIG. 6 is a schematic cross-section of a coating chamber showing an anode assembly having a continuously replaceable surface.

Yet another embodiment of the present invention is shown in FIG. 6. Here, the electron collecting surface of side anode 110 is constantly replaced before it becomes contaminated.

The embodiment of FIG. 6 employs top anode assembly 62. As noted, anode 62 comprises of a front plate 66 and a plurality of additional plates 68a, 68b separated from each other and electrically-connected by spacers 70. Anode 62 is mounted to, but electrically isolated from, top cover 26 by insulating mounts 72. The front plate 66 may be located about 2 or 3 inches from the periphery of the cathode. The top anode extends along the length of cathode 31.

Side anode structures 110 each comprise spool guides 112 mounted on brackets 114 attached to mounts 82 on internal chamber wall 38. The brackets 114 are electrically insulated from mounts 82 by bushings 116. Anodes 110 each also include a supply spool 118 having wound upon it a roll of aluminum foil 120. The foil is preferably about 0.005 inches thick. Foil 120 is passed over a guide roller 124, between the guides 112, and wound in the direction shown by arrow A onto to a take-up spool 128. The spools extend along the length of the cathode 31. The spool 128 is provided with a drive system located outside of the vacuum enclosure. The drive system is connected through the side wall of the enclosure with the spool. The drive system details have been omitted for clarity, as they should be apparent to those skilled in this art.

The winding of foil sheet 120 from supply spool 118 to take-up spool 128 occurs continuously during the operation of the magnetron sputtering system. This is done at speed such that exposed foil sheet 120 is removed from the vicinity of cathode 31 before the foil is contaminated by coating material. The foil sheet may be moved at about one-inch per minute to achieve this result. The winding direction A is chosen such that the previously exposed surface of foil 120 becomes buried inside roll 126 which forms on take-up spool 128. The outer surface of roll 126 is thus formed by the surface of foil 120 which faces away from cathode 31. Since it has been sheltered from material directly sputtered from cathode 31, it is clean and conductive.

Figure 7:
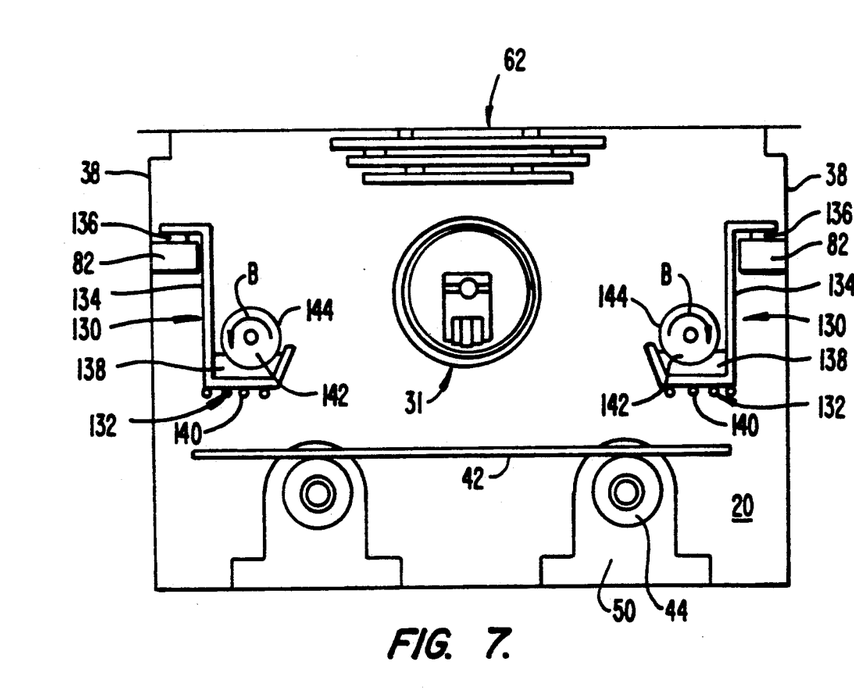
FIG. 7 is a schematic cross-section of a coating chamber showing an anode assembly having a liquid surface.

Another embodiment of the present invention is shown in FIG. 7. Here, a clean conductive anode surface is provided by continuously circulating a molten metal. Top anode 62 may be like that of FIG. 1.

Side anodes 130 extend along the entire length of cathode assembly 31. The side anodes each comprise a metal trough 132, typically about four inches wide by three inches deep, attached to a mount 82 on internal wall 38 of chamber 20 by means of a bracket 134. Bracket 134 is electrically isolated from wall 38 by an insulating bushing 136. The trough 132 contains a metal 138 having a melting point less than about 700° C., for example, lead, tin or indium. The metal is melted and maintained in a molten state during the sputtering process by means of a resistance heating element 140.

A roller 142 is immersed in the molten metal 138, and the roller is rotated such that it becomes coated with the molten metal. The direction of the roller's rotation is indicated by arrow B. The direction of rotation is chosen such that a clean fresh metal surface 144 is presented to cathode 31 during the coating operation. The surface 144 once contaminated is recirculated into the molten metal pool 138 where the contaminating material floats free from the roller.

Figure 8:
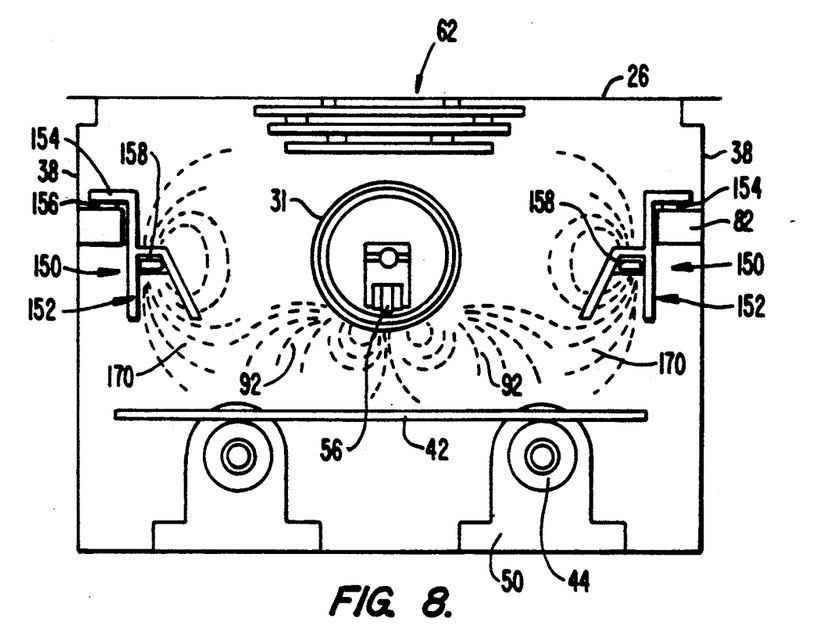
FIG. 8 is a schematic cross-section of a coating chamber showing a magnetically-enhanced anode assembly.
Figure 9:
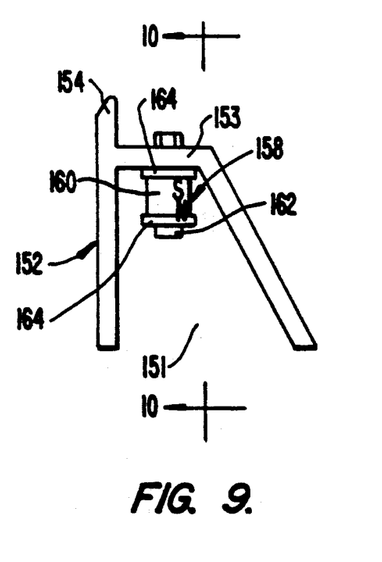
FIG. 9 is a schematic view illustrating the anode assembly of FIG. 8 in greater detail.
Figure 10:
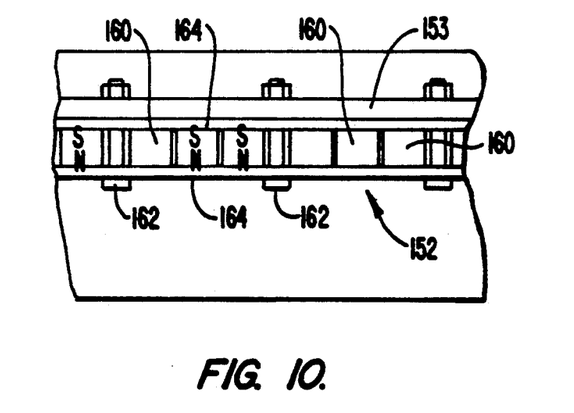
FIG. 10 is a schematic view showing a portion of the structure of FIG. 9 along line 10—10 of FIG. 9.

As shown in FIGS. 8-10, a further embodiment of the present invention employs a magnet array in the anode structure to provide a magnetic field which traps escaping electrons. More specifically, the magnetic field traps those electrons escaping along preferred path 92 (see FIG. 3) at the outer edge of the magnetron tunnel field and guides them to anodes 150. This embodiment also incorporates the above-described anode structure 62. The side anodes 150 each have an electron-collecting surface in the form of an inverted trough-shaped member 152. The inverted trough-shaped member is mounted on a bracket 154 which, in turn, is secured to a mounting structure 82 at internal wall 38. Bracket 154 is electrically insulated from mount 82 by a bushing 156. Trough-shaped member 152 is preferably about four inches deep and has an opening 151 about three inches wide.

A magnet array 158 is mounted by bolts 162 to the base 153 of trough-shaped member 152. The magnetic array 158 may comprise an array of small permanent bar magnets 160 clamped together by copper strips 164 and bolts 162 to the trough-shaped member 152. The trough-shaped member 152 and magnet array 158 extend along the length of the cathode 31.

The magnet array 158 creates magnetic lines of force in the region 170 (FIG. 8) which extend to substrate 42. The magnetic force lines in region 170 follow an arcuate path and link with the magnetic force lines in region 92, which are created by the magnet array 56 of cathode 31. Electrons being repelled away from the cathode in region 92 are thus guided by magnetic force lines in region 170 into trough-shaped member 152.

An advantage of this embodiment is that the magnetic force lines in region 170 create a magnetic barrier which prevents electrons from escaping through the gap between side anode structure 150 and substrate 42. This is the area where electrons are most likely to escape. This magnetic trap principle can be extended by the use of additional magnet arrays in the chamber to close off all possible electron escape routes, ensuring that they are collected by an anode of the desired shape and electrical properties.

Figure 11:
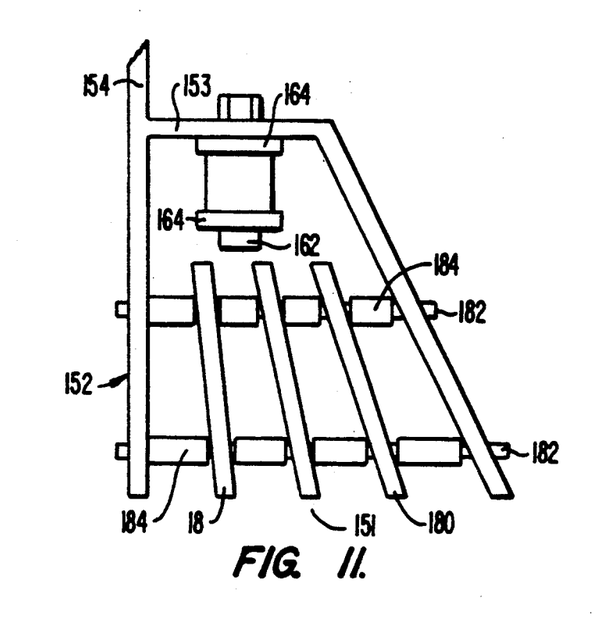
FIG. 11 is a schematic view showing a magnetically-enhanced anode assembly with an expanded collection area.

A disadvantage of the above-described magnetic-guided anode is that the anode surface area is relatively small and not well protected from contamination. The anode of FIG. 11 is configured to eliminate this disadvantage by adding an additional electron collecting area. This anode structure comprises the basic trough-shaped member 152 and an array of bar magnets 160 clamped between strips 164 by bolts 162. Additionally, a set of plates 180 extend across the trough-shaped member 152. Plates 180 are preferably about two inches wide and extend the entire length of trough-shaped member 152. The plates are electrically- and mechanically-connected to each other and to the trough by pins 182 and spacers 184 placed at appropriate intervals.

Figure 12:
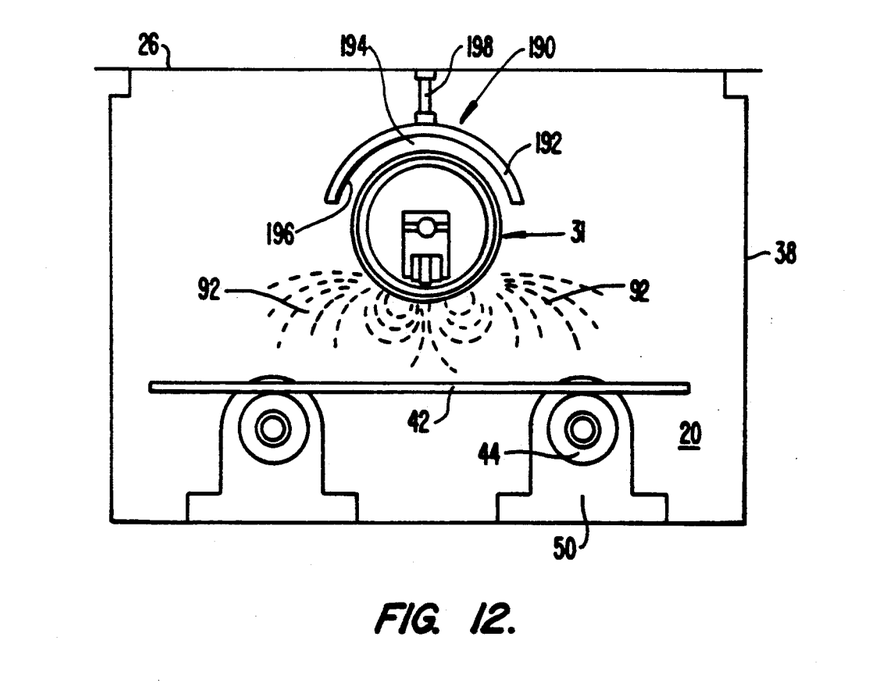
FIG. 12 is a schematic cross-section through a coating chamber showing yet another embodiment of an anode assembly in accordance with the present invention.

Still another embodiment of the present invention is shown in FIG. 12. This is a rather simple configuration which does not provide as large a collecting area as the other configurations discussed above. However, it is simple to install and maintain.

Here, anode 190 comprises a single arcuate-shaped structure shaped substantially in the form of a half-cylinder 192. The structure is placed in coating chamber 20 such that gap 194 between cathode 31 and the anode is greater than the dark space length. The anode surface facing cathode 31 contacts the sputtering discharge. As in previous embodiments, gap 194 should be significantly greater than the dark space length, a distance of 1 to 2 inches should be adequate. If the gap is not significantly greater than the dark space length, arcing between the cathode 31 and structure 192 may result. The anode 190 extends substantially along the length of cathode 31.

The extent to which the anode surrounds the cathode will depend on the material sputtered, the sputtering conditions, and the shape and size of the coating chamber. A larger half-cylinder will bring the anode structure closer to the electron escape regions 92. However, as the anode surface facing the cathode becomes contaminated, and thus insulated, electrons will have difficulty migrating out of gap 194 to the cleaner rear surface 196 of half-cylinder 192. Adequate operation would be expected if half-cylinder 192 surrounds cathode 31 over approximately half of the cathode circumference, as shown in FIG. 12.

The anode structure 190 is electrically-isolated from top 26 of vacuum chamber 20 by insulator 198 which enables it to be electrically connected in different ways as discussed in previous embodiments.

Of course, the shape of the anode may be something other than a semicircle as shown. For instance, the shape could be a polyhedral section having two or more sides, provided that the separation criterion previously described is satisfied at all points on the surface.

All of the embodiments discussed above have been described as being configured such that material is sputtered down from the cathode to the substrate. This is the usual configuration for in-line systems for the coating of architectural glazings. However, in-line coating systems can also be configured such that material is sputtered upwards onto substrates passing over the cathode assembly, or with the cathode assembly mounted vertically such that material is sputtered horizontally onto substrates held in a vertical position. This vertical orientation has the advantage that it can readily be configured to sputter simultaneously onto both sides of an article. In any event, the principles of the invention are applicable to these different configurations.

The present invention has been described in terms of a preferred embodiment. The invention however is not limited to the embodiment described and depicted. Rather, the scope of the invention is limited by the appended claims.

What is claimed is:

1. Apparatus for sputtering a material on a substrate, comprising:

an evacuable coating chamber including two opposing end walls, each of said end walls having an opening therein to allow passage of the substrate;

at least one rotating cylindrical magnetron cathode mounted in said coating chamber, said cathode having an axis of rotation and mounted between said end walls with said axis of rotation generally parallel thereto, and said cathode having a layer of the material to be sputtered thereon and an elongated sputtering zone extending lengthwise thereof;

at least one auxiliary anode mounted in said coating chamber between at least one of said end walls and said cathode, said anode including at least one substantially rectangular plate, and said anode extending substantially along said cathode and separated therefrom by a distance greater than a dark space length; and means in said coating chamber for transporting the substrate between said openings and past said sputtering zone.

2. The apparatus of claim 1 wherein said anode is electrically-isolated from said coating chamber.

3. The apparatus of claim 2 further including means for making electrical connection to said anode.

4. The apparatus of claim 1 wherein said anode includes means for extending the surface area thereof.

5. The apparatus of claim 4 wherein said surface area extending means include a plurality of plates electrically-connected together but spaced from one another.

6. The apparatus of claim 5 wherein said plates are substantially parallel to each other.

7. The apparatus of claim 6 where the plate closest to the cathode shields the other plates from material sputtered from the cathode.

8. The apparatus of claim 1 wherein said anode includes a plurality of sections, electrically isolated from each other and arranged substantially in a line extending along the length of the cathode.

9. The apparatus of claim 8 further including means for making electrical connection to said sections such that each may have a different electrical potential.

10. The apparatus of claim 9 wherein said sections include means for extending the surface area thereof.

11. The apparatus of claim 10 wherein said surface area extending means include a plurality of plates electrically connected together and spaced from one another.

12. Apparatus for sputtering a material on a substrate, comprising an evacuable coating chamber including two opposing end walls, each of said end walls having an opening therein to permit passage of the substrate therethrough;

at least one rotating cylindrical magnetron cathode mounted in said coating chamber, said cathode having an axis of rotation and mounted between said end walls with said axis of rotation generally parallel thereto, and said cathode having a layer of the material to be sputtered thereon and an elongated sputtering zone extending lengthwise thereof;

at least one auxiliary anode mounted in said coating chamber between one of said end walls and said cathode, said anode extending substantially along the length of said cathode and separated therefrom by at least a dark space length, and said anode including magnetic means for guiding electrons thereto; and means for transporting the substrate between said openings and past said sputtering zone.

13. The apparatus of claim 12 wherein said magnetic means extends along the length of said anode.

14. The apparatus of claim 13 wherein said anode includes means for extending the surface area thereof.

15. Apparatus for sputtering a material on a substrate, comprising:

an evacuable coating chamber including two opposing end walls, each of said end walls having an opening therein to permit passage of the substrate therethrough;

at least one rotating cylindrical magnetron cathode mounted in said coating chamber, said cathode having an axis of rotation and mounted between said end walls with said axis of rotation generally parallel thereto, and said cathode having a layer of the material to be sputtered thereon and an elongated sputtering zone extending lengthwise thereof;

at least one auxiliary anode having an electron collecting surface and mounted in said coating chamber between one of said end walls and said cathode, said anode extending substantially along the length of said cathode and separated therefrom by a distance greater than a dark space length, and replacement means for replacing the electron collecting surface during sputtering; and means for transporting the substrate between said openings and past said sputtering zone.

16. The apparatus of claim 15 wherein said replacement means includes:

a supply spool and a take-up spool, said spools being mounted a distance apart about two times a cathode diameter and extending along the length of the cathode;

a length of electrically-conductive flexible material stored on said supply spool; and means for winding said conductive material from said supply spool onto said take-up spool during sputtering such that a clean portion of said length of said conductive material may be exposed to the cathode.

17. The apparatus of claim 16 further comprising at least one guide roller for extending the path of said conductive material from said supply spool to said take-up spool.

18. The apparatus of claim 15 wherein said replacement means includes a trough containing a metal having a melting point less than about 700° C., means for heating said trough to melt said metal, and means for circulating said metal in its molten form.

19. The apparatus of claim 18 wherein said circulating means is a roller extending along the length of said trough and partially immersed in said metal.

20. Apparatus for sputtering thin films on a substrate, comprising:

an evacuable coating chamber having a top wall, a base, two opposing sidewalls and two opposing end walls, said end walls each having an opening therein to permit passage of the substrate therethrough;

at least one rotating cylindrical magnetron cathode mounted in said coating chamber, said cathode having an axis of rotation and mounted between said end walls with said axis of rotation generally parallel thereto, and said cathode having a layer of material to be sputtered thereon and an elongated sputtering zone extending lengthwise thereof;

means in said coating chamber for transporting the substrate between said openings, below said cathode, and past said sputtering zone;

first and second anodes mounted in said coating chamber on opposite sides of said cathode and above said transporting means, each of said anodes extending along said cathode and separated therefrom by a distance greater than a dark space length, said of said anodes including a plurality of plates;

said plates having a length about equal to the length of said cathode, and a width between about one, and one and one-half times a diameter of said cathode; and said plates being arranged parallel to each other in a face-to-face relationship, with the faces vertically oriented and said plates separated from each other by a distance greater than the dark space length, and electrically connected such that each may have the same electrical potential.

21. The apparatus of claim 20 further including:

a third anode mounted above said cathode at said top wall, said anode extending along the length of said cathode and separated therefrom by a distance greater than the dark space length;

said third anode including a plurality of plates;

said plates of said third anode having a length about equal to the length of said cathode and each plate having a different width, the widest of said plates having a width about equal to two times the diameter of said cathode and the narrowest of said plates having a width about one and one-half times the diameter of said cathode; and said plates of said third anode being arranged in order of increasing width with the narrowest of said plates closest to said cathode, and said plates parallel to each other in a face-to-face relationship, with the faces thereof oriented horizontally; and said plates of said third anode separated from each other by a distance greater than the dark space length, and electrically connected such that each may have the same electrical potential.

22. The apparatus of claim 21 wherein said first, second and third anodes each include three plates.

23. The apparatus of claim 22 wherein at least one of said first, second and third anodes is electrically connected to said coating chamber.

24. The apparatus of claim 22 wherein at least one of said first, second and third anodes is electrically isolated from said coating chamber.

25. The apparatus of claim 24 further including means for making electrical connection to said first, second and third anodes.

26. Apparatus for sputtering thin films on a substrate comprising:

an evacuable coating chamber having a top wall, a base, two opposing sidewalls, and two opposing end walls, said end walls each having an opening therein to permit passage of the substrate therethrough;

at least one rotating cylindrical magnetron cathode mounted in said coating chamber, said cathode having an axis of rotation and mounted between said end walls with said axis of rotation generally parallel thereto, and said cathode having a layer of material to be sputtered therein and an elongated sputtering zone extending lengthwise thereof;

means in said coating chamber for transporting the substrate between said openings, below said cathode, and past said sputtering zone;

first and second anodes mounted in said coating chamber on opposite sides of said cathode and above said transporting means, each of said first and second anodes including at least three sections each electrically isolated from each other and extending along the length of said cathode and separated therefrom by a distance greater than a dark space length;

said sections including a plurality of plates having about the same dimension;

said plates having a length about equal to one-third the length of said cathode, and a width between about one and one and one-half times a diameter of said cathode; and said plates being arranged parallel to each other in a face-to-face relationship with faces thereof oriented vertically and said plates separated from each other by a distance greater than the dark space length, and electrically connected such that each may have the same electrical potential.

27. The apparatus of claim 26 further including:

a third anode mounted above said cathode, said third anode extending along the length of said cathode and separated therefrom by a distance greater than the dark space length; said anode including at least three sections electrically isolated from each other and extending along the length of said cathode;

said sections of said third anode including a plurality of plates;

said plates having a length about equal to the length of said cathode, each plate having a different width, the widest thereof having a width about equal to two times the diameter of said cathode and the narrowest thereof having a width about one and one-half times the diameter of said cathode;

said plates being arranged in order of increasing width, with the narrowest of said plates closest to said cathode and parallel to each other in a face-to-face relationship with the faces thereof oriented horizontally; and said plates being separated from each other by a distance greater than the dark space length, and electrically connected such that each may have the same electrical potential.

28. The apparatus of claim 27 wherein each section includes three plates.

29. The apparatus of claim 28 including means for providing electrical connection to each section.

30. Apparatus for sputtering thin films on a substrate comprising:

an evacuable coating chamber including two opposing end walls, each of said end walls having an opening therein to permit passage of the substrate therethrough;

at least one rotating cylindrical magnetron cathode mounted in said coating chamber, said cathode having an axis of rotation, said cathode being mounted between said end walls with said axis of rotation generally parallel thereto, and said cathode having a layer of the material to be sputtered thereon and an elongated sputtering zone extending lengthwise thereof;

means in said coating chamber for transporting the substrate between said openings, below said cathode, and past said sputtering zone;

first and second anodes mounted in said coating chamber on opposite sides of said cathode and above said transporting means, each of said anodes including a trough shaped member having a base and an opening, said trough-shaped member extending along the length of said cathode and mounted so said opening faces downwards toward the substrate; and magnetic means for producing a magnetic field following an arcuate path between the opening in said trough and said cathode, said magnetic means mounted within said trough-shaped member along the length thereof.

31. The apparatus of claim 30 further including a third anode mounted above said cathode, said anode extending along the length of said cathode and separated therefrom by a distance greater than the dark space length;

said third anode including a plurality of plates said plates having a length about equal to the length of said cathode and each plate having a different width, the widest thereof having a width about equal to one and one-half times the diameter of said cathode and the narrowest thereof having a width about equal to the diameter of said cathode;

said plates being arranged in order of increasing width and parallel to each other in face-to-face relationship with the faces thereof oriented horizontally, and with the narrowest of said plates closest to said cathode; and said plates being separated from each other by a distance greater than the dark space length, and electrically connected such that each may have the same electrical potential.

32. The apparatus of claim 30 wherein said trough-shaped member further includes a plurality of plates extending along the length thereof, said plates separated from each other and electrically-connected to each other and to said trough-shaped member.

33. Apparatus for sputtering a material on a substrate, comprising:

an evacuable coating chamber including two opposing end walls, each of said end walls having an opening therein to allow passage of the substrate therethrough;

at least one rotating cylindrical magnetron cathode mounted in said coating chamber, said cathode having an axis of rotation and mounted between said end walls with said axis of rotation generally parallel thereto, and said cathode having a layer of the material to be sputtered thereon and an elongated sputtering zone extending lengthwise thereof;

at least one auxiliary anode mounted in said coating chamber, said anode located on the opposite side of said cathode from said sputtering zone, and said anode including an elongated arcuate shaped member extending substantially along the length of said cathode and separated therefrom by a distance greater than a dark space length; and means in said coating chamber for transporting the substrate between said openings and past said sputtering zone.

34. Apparatus for sputtering a material on a substrate, comprising:

an evacuable coating chamber including two opposing end walls, each of said end walls having an opening therein to allow passage of the substrate;

at least one rotating cylindrical magnetron cathode mounted in said coating chamber, said cathode having an axis of rotation, and mounted between said end walls with said axis of rotation generally parallel thereto, and said cathode having a layer of the material to be sputtered thereon and an elongated sputtering zone extending lengthwise thereof;

at least one anode distinct from said coating chamber located therein between at least one of said end walls and said cathode, and said anode extending substantially along said cathode and separated therefrom by a distance greater than a dark space length; and means in said coating chamber for transporting the substrate between said openings and past said sputtering zone.

* * * * *

UNITED STATES PATENT AND TRADEMARK OFFICE
CERTIFICATE OF CORRECTION

PATENT NO. : 5,106,474

DATED : April 20, 1992

INVENTOR(S) : Eric R. Dickey, et al

It is certified that error appears in the above-identified patent and that said Letters Patent is hereby corrected as shown below:

In claim 20, column 12, line 14, delete the first "said" and insert "each".

In claim 26, column 13, line 2, delete "therein" and insert "thereon", and line 23, insert a comma after "vertically".

Signed and Sealed this

Sixteenth Day of November, 1993

Attest:

BRUCE LEHMAN

Attesting Officer

Commissioner of Patents and Trademarks